United States Patent [19]

Carp et al.

[11] 4,238,813

[45] Dec. 9, 1980

[54] COMPENSATED DUAL INJECTOR DRIVER

[75] Inventors: Ralph W. Carp; Danny O. Wright, both of Newport News, Va.

[73] Assignee: The Bendix Corporation, Southfield, Mich.

[21] Appl. No.: 41,265

[22] Filed: May 21, 1979

[51] Int. Cl.³ .......................................... H01H 47/32
[52] U.S. Cl. .................................. 361/154; 123/490
[58] Field of Search ............... 361/152, 154, 190, 191, 361/192, 193, 194; 123/32 EA

[56] References Cited

U.S. PATENT DOCUMENTS

| | | | |
|---|---|---|---|
| 3,786,314 | 1/1974 | Misch | 361/194 |
| 3,946,287 | 3/1976 | Hopkins | 361/193 |
| 4,048,665 | 9/1977 | Lia et al. | 361/152 |
| 4,144,757 | 3/1979 | Yokoyama | 361/154 |
| 4,148,090 | 4/1979 | Kawai et al. | 361/154 X |
| 4,173,030 | 10/1979 | Rabe | 361/154 |
| 4,180,026 | 12/1979 | Schulzke et al. | 361/154 |

*Primary Examiner*—Harry E. Moose, Jr.
*Assistant Examiner*—L. C. Schroeder
*Attorney, Agent, or Firm*—William A. Marvin; Russel C. Wells

[57] ABSTRACT

A compensated dual injector driver circuit for controlling the current to either of a pair of electromagnetic solenoid fuel injectors is disclosed. The driver circuit includes a pair of analog bilateral switches operably connected to the control terminals of two driver transistors whose power terminals are coupled serially with the coils of the injector solenoids. A driver amplifier generating a current control signal for the driver transistors is connected to a common input of the two switches. Either of the switches is selected for closure by a logical input from a select line thereby choosing the individual injector to be energized. The driver amplifier in response to the leading edge of a control pulse regulates the conductance of the selected transistor with the current control signal to initially draw current through the injector coil until it reaches a peak value. At the time the peak current is attained, the driver amplifier then switches the control current to a holding value. The peak and the holding current levels are measured by a negative feedback loop from a sense resistor commonly connected in series with each set of coils and driver transistors to indicate the magnitude of current therethrough. The circuit further includes a means for controllably collapsing the magnetic field stored in the injector coils when the injector driver transistors are turned off in response to the trailing edge of the control pulse. Compensation is provided to the driver amplifier for altering the hold level current in accordance with variations in the battery voltage. The differing levels of hold current with changing battery voltage will modify the closing time of the injector oppositely to those changes produced in the opening times by the battery voltage.

16 Claims, 3 Drawing Figures

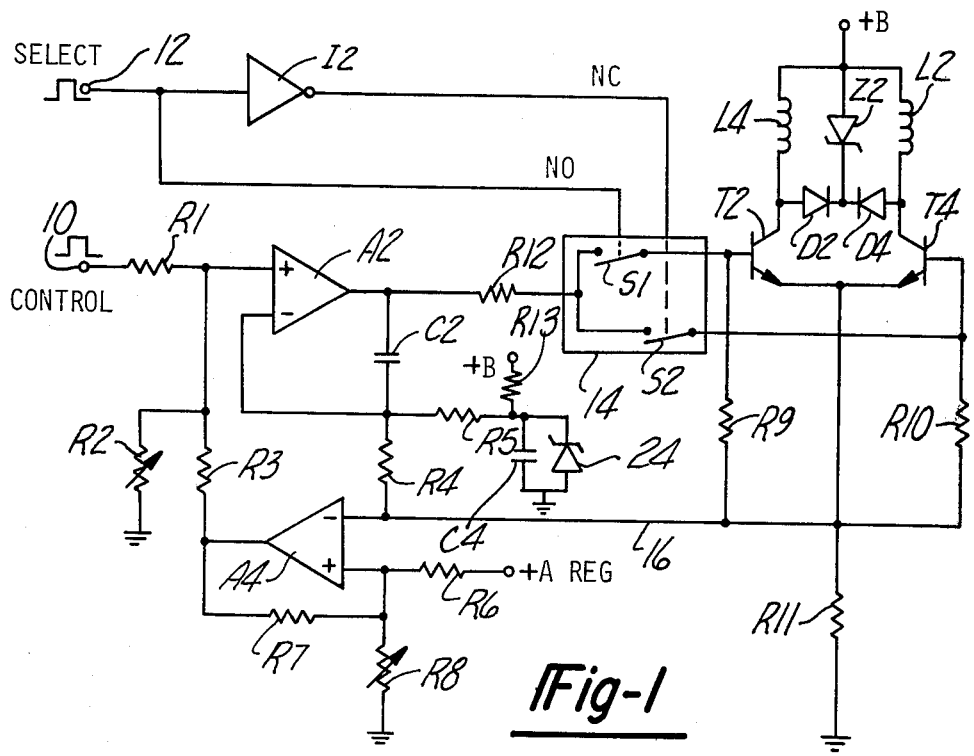
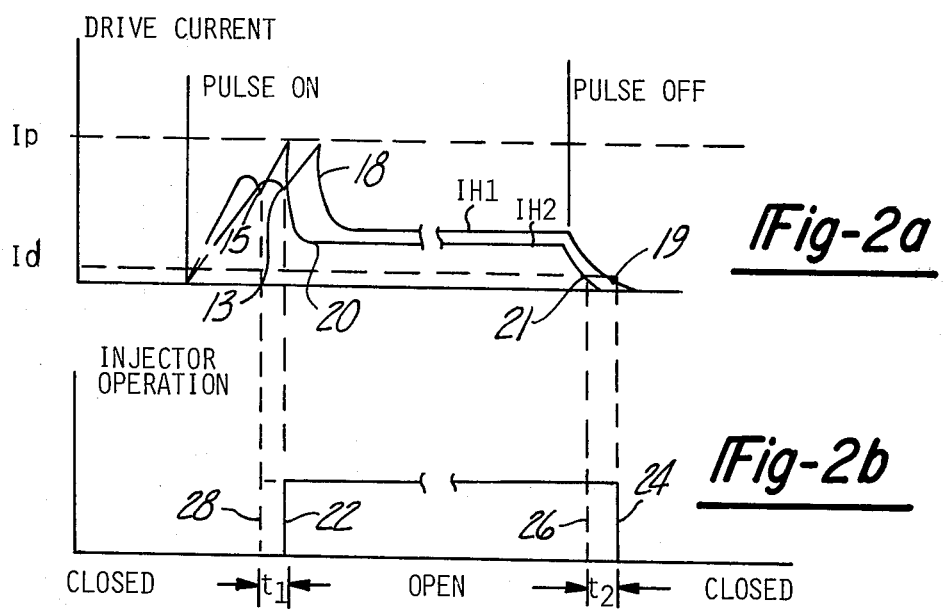

COMPENSATED DUAL INJECTOR DRIVER

BACKGROUND OF THE INVENTION

The invention pertains generally to control circuits for the actuation of solenoid devices and is more particularly directed to a driver circuit for controlling the current to the solenoid of an electro-magnetic fuel injector.

For the precise control of the air/fuel ratio of an internal combustion engine electronic fuel injection systems are being widely used today. These systems have an electronic control unit which generates a pulse width signal whose duration is indicative of the quantity of fuel to be input to the engine by sensing the instantaneous engine operating parameters. The pulse width signal controls the opening and closing of a plurality of electro-magnetic fuel injectors having solenoid actuated valves.

During the energized state of the injectors pressurized fuel is metered through the valve by an orifice or nozzle producing a predetermined flow rate. The flow rate multiplied by the actual open time of the injector will determine the quantity of fuel input to the engine. The precision of fuel flow control will be dependent upon matching the actual opening and closing times of the injectors to the duration of the control pulse from the electronic control unit.

Generally, solenoid driver circuits have been used to interface the electronic control unit and the fuel injectors. The solenoid driver circuits attempt to more equally match the mechanical operating characteristics of the valves to the electrical pulse width by regulating the current and voltage levels necessary to open and close the solenoids. The solenoid driver circuits may additionally gate the pulse width to individual groups of injectors.

One such prior art circuit that is known to be advantageous for the operation of this type of solenoid injector includes circuitry for generating a peak current through the coil of the injector solenoid in excess of the amount that is needed to open the valve or "pull in" the armature and then switching to a holding current which is above that at which the armature will close the valve or "drop out." This method insures the rapid opening of the injector by the peak current and the efficient use of power thereafter by the lower holding current which also allows the injector to close more quickly.

However, not all solenoid injectors will operate consistently at their "pull in" current value and therefore the peak value must be set to a point sufficiently high enough to ensure all injectors will be open every time it is reached. This is because it is difficult to predict the exact opening time of an injector by assigning a certain current value as the value may change with age and will not be the same for different injectors. However, the opening of the valve can be predicted to occur sooner at higher battery voltage or later at lower battery voltage because the L/R time constant controlling the rise in current in the coil of the solenoid to the peak value will not change. Thus, to minimize inherent mechanical error, the valve should be opened as quickly as possible with the maximum battery voltage available.

In automotive systems differences in battery voltage may occur under air conditioning loads, cold cranking, and other conditions. The lack of regulation in the battery voltage will cause the injectors to open and close at undeterminable points. This will cause an error which is uncalibrated for in the electronic control unit and which is dependent upon the physical characteristics of the solenoids and variations in the applied source voltage.

At least two previous systems have attempted to overcome this problem. Illustrative of one solution is U.S. Pat. No. 3,725,678 issued to Reddy which is commonly assigned with the present application. The disclosure of Reddy is hereby expressly incorporated herein by reference. Reddy eliminates the opening and closing time differentials due to battery voltage change by closely regulating the voltage applied across the coils of the solenoids during the time the current is building to a peak and during the holding current period.

While advantageously equalizing the solenoid operational characteristics the regulated voltage initially applied to the coils is necessarily less than the full battery voltage available. As previously mentioned the application of the maximum battery voltage available at the opening wll permit the solenoid to operate in the shortest period of time and minimize the inherent mechanical error. This rapid operation is becoming increasingly important as the control pulse widths become shorter and linearity for the injector operation is necessitated into the millisecond operating range.

Another U.S. Pat. No. 4,092,717 issued to Di Nunzio discloses a system for stabilizing the opening time of an electromagnetic injector against variations in vehicle battery voltage. Di Nunzio teaches measuring a battery dependent delay from the termination of the control pulse until an empirically determined "drop out" current is reached and then subtracting that value from the subsequent injection cycle which initiates at an empirically determined "pull in" current.

In this type of system the pulse width indicating an error is not compensated according to deviation presently occurring but by that of a previous pulse width. Counting error in such a system may tend to accumulate rather than cancel. More importantly empirical measurement of two changing values of current for each injector must be made.

Further to more adequately equalize the closing times of the solenoid injectors the prior art has used a Zener diode connected between the coils of the injectors and a reference voltage. The Zener upon the disruption of the current supply to the coils will allow the voltage on the coil to build until it exceeds the breakdown voltage of the diode. Thereafter, the Zener produces a controlled rate of decay or dissipation of the stored energy so that the injectors close at the same rate every time. The time of closure after termination of the control pulse is however a function of the holding current level. The energy stored in the coils at turn off is $\frac{1}{2}Li^2$ and thus varies as the square of the holding current. The greater the holding current the longer it will take at the controlled decay rate to reach the drop out current.

SUMMARY OF THE INVENTION

The invention provides a method and apparatus for controlling a solenoid such that the operational times of the armature upon energization and release are stabilized in order to more nearly match the mechanical actuation of the solenoid to the pulse width of a control signal. In a preferred implementation the apparatus controls the current through the coil of a solenoid actuating an electromagnetic fuel injector.

The apparatus comprises a solenoid driver circuit including a means responsive to the presence of a control pulse signal for operably connecting a coil of a fuel injector to a voltage source through a current path and for controlling the conductance of the current path so that the current through the coil reaches a peak current level in excess of the pull-in current of the injector. The connecting means thereafter controls the conductance of the current path to reduce the current through the coil to a holding current level in excess of the drop-out level of the injector. Further included are means for discharging the energy stored in the coil at a controlled or constant rate upon the termination of the control signal.

The driver circuit further comprises a means for regulating the hold current at a level which will cause the turn off time of the solenoid to be oppositely varied by an amount equivalent to the amount the turn on time of the solenoid is varied by changes in the battery voltage. This regulation means will equalize the errors in the opening and closing time of the injector for variations in the battery voltage.

In a preferred implementation the connecting means comprises a driver amplifier operably connected at its output to the common terminal of a pair of bilateral switches which are connected at their other contacts to the control terminals of a pair of driver transistors. The bilateral switches are closed by a select signal which will connect only one of the driver transistors according to the logic level input from a select line. With this configuration grouping of the injectors may be facilitated and circuit costs reduced by driving more than one injector per driver. Either of the injectors can be assigned to multiple groups as long as the control pulses to both injectors of the pair are not to be overlapped. Timing and operational sequencing are easily accomplished in this manner.

Therefore it is an object of the invention to provide a dual injector driver whereby one of the injectors may be selected for energization with a select signal and controllably driven with a control pulse.

Further it is an object of the invention to provide such a driver with stabilized opening and closing times to more nearly match the duration of the control signal pulse to the injected fuel quantity.

Further still it is an object of the invention to provide the stabilization by regulating the hold current in proportion to the changes in battery voltage.

These and other features, advantages and aspects of the invention will be more fully understood and better explained if a reading of the Detailed Description is undertaken in conjunction with the appended drawings wherein.

BRIEF DESCRIPTION OF THE DRAWINGS

FIG. 1 is a detailed electrical schematic diagram of a dual solenoid driver circuit constructed in accordance with the invention;

FIG. 2a is a representative waveform diagram pictorially illustrating the current through the coil of a solenoid driven by the circuit illustrated in FIG. 1; and FIG. 2b is a representative waveform diagram of the actuation of the armature of the solenoid in a timed relationship to the current waveform illustrated in FIG. 2a.

DETAILED DESCRIPTION OF THE PREFERRED EMBODIMENT

With respect now to FIG. 1 there is shown a dual solenoid driver circuit incorporating the advantages of the invention. The driver circuit comprises a driver amplifier A2 whose output via a resistor R12 can be operably coupled through analog switches S1 or S2 to the base terminals of a pair of NPN driver transistors T2 and T4 respectively. Upon the closure of a switch the output of amplifier A2 will control the conductance of the associated transistor.

Switches S1 and S2 in the preferred form are solid state bilateral devices with individual input terminals determining their state of operation. Switch S1 has its input terminal connected to a select signal via a select terminal 12 and switch S2 has its input terminal connected to the inversion of the select signal via its connection to the output of inverter I2. Normally, the select terminal in the absence of a select signal is at a low logic level and switch S1 is open and switch S2 is closed. A transition to a high logic level at the select terminal 12 indicating the presence of a select signal will reverse these states and switch S1 will close and switch S2 will open.

The driver amplifier A2 has a control voltage applied to the noninverting input from a control terminal 10 via an input resistor R1. The control voltage is a pulse width whose duration is indicative of the quantity of fuel to be input to the engine. The control voltage pulse is preferably output from an electronic control unit (ECU) of a fuel injection system which calculates the pulse width as a function of at least one operating parameter of the engine. An ECU of this type is more fully shown in a copending application Ser. No. 918,306 filed on June 22, 1978 in the name of Carp et al. The disclosure of Carp is hereby expressly incorporated by reference herein. With reference to Carp et al., each coil or inductor L2, L4 can represent a group of four parallel fuel injectors which can be selected at 180° intervals of engine crankshaft revolution by the signal FFS.

The control pulse voltage which is a nominal logic level of +5 V and 0 V is divided down to a predetermined fraction of the input voltage from the control terminal by the input resistor R1 and a variable resistor R2 connected between the noninverting input and ground.

The driver amplifier A2 operates in a closed loop fashion as a voltage follower by having a regulation voltage applied at its inverting input from the junction of a pair of divider resistors R5 and R4 connected between the battery supply voltage +B and a sense line 16. The voltage on the sense line 16 is representative of the current drawn through the coils of the controlled solenoids. The regulation voltage at the inverting input of amplifier A2 varies with the voltage of the battery voltage +B and primarily as the voltage on the sense line 16. A capacitor C2 for controlling the slew rate of the amplifier A2 is further connected between its output and the inverting input.

The battery voltage +B is coupled through a resistor R13 to a filtering and clamping circuit comprising the parallel configuration of a capacitor C4 and a Zener diode Z4 connected between the resistor R5 and ground. The Zener diode Z4 has a nominal breakdown voltage of 15 V and clamps the battery voltage +B to 15 V if it increases beyond this point. The filter smooths out variations in the battery voltage and has a time constant in excess of the maximum control pulse signal for the circuit.

Each driver transistor, for example transistor T2, is connected to an associated coil or inductive load L4 at its collector and by its emitter to a sense resistor R11. The other terminal of the coil L4 is coupled to the battery voltage +B and the sense resistor R11 is grounded at its other terminal. Similarly the driver transistor T4 is coupled at its collector to the inductor L2 and at its emitter to the sense resistor R11. The other terminal of the inductor L2 is coupled to the battery voltage +B. Each driver transistor T2, T4 has a "pull down" resistor R9, R10 respectively connected between its base and the sense line 16.

The configuration of the driver transistors T2, T4 and coils L4 and L2 respectively form serial current paths through the inductors, transistors, and the sense resistor from the battery voltage +B to ground. By controlling the conductance of each driver transistor the amount of current through the inductive loads and as a consequence the operation of each solenoid can be regulated. The sense resistor R11 is chosen as a low value in the order of tenths of one ohm, to provide a voltage indication of the current drawn through the inductance of the coil to the sense line 16 without a large power dissipation.

Importantly, the connection of the serial current path of the coil, transistor, and battery voltage allows the coil to charge at the maximum rate when the driver transistor is saturated. The maximum charging rate will produce the fastest opening of the injector and contribute to the linearity for injector pulse widths into the millisecond range.

Coupled to each inductor L2, L4 through blocking diodes D4 and D2 respectively is a Zener diode Z2 with its cathode commonly connected with the cathodes of the blocking diodes and its anode connected to the battery voltage +B. The Zener diode Z2 will, after each of the power transistors is turned off allow a positive voltage to build from the collapsing field of the energized inductive loads until it reaches the Zener breakdown voltage. The Zener diode Z2 thereafter will dissipate energy from the inductor at a constant rate by regulating the impedance apparent to the collapsing electromagnetic field. In the configuration shown a higher breakdown voltage will increase the rate of energy dissipation. Of course, the breakdown voltage must be low enough so that the driver transistors will not break down.

Further coupled to the sense line 16 is a comparator A4 which compares the voltage developed on the sense line, received at its inverting input, to a threshold voltage provided at its noninverting input. The noninverting input is connected to a junction of a pair of divider resistors R6 and variable resistor R8 connected between a regulated voltage +A and ground. The junction voltage of the divider forms part of the threshold voltage and another part is formed by the control terminal voltage through the serial path of resistors R1, R3, R7, and R8.

When the sense voltage exceeds the voltage threshold, the comparator A4 will switch into a conducting state and ground the junction of resistors R3 and R7 through its output. The function of the comparator A4 when conducting is to change the voltage levels applied to the noninverting input of amplifier A4 and the voltage applied to the noninverting input of amplifier A2.

Operationally, the driver circuit functions to control current through coils L4 and L2 in response to the select and control signal levels. The select input is supplied with a logic signal of one of two levels and if the level is high switch S1 will be closed and if the signal is low the inverter I2 will close the switch S2. Depending upon which switch is closed one of the bases of the driver transistors T2 and T4 will be operatively coupled to the output of the amplifier A2.

In a quiescent state with no control pulse applied, the voltage at the inverting input of amplifier A2 is greater than the voltage at the noninverting input and the amplifier is off. The selected driver transistor is therefore nonconducting. Additionally, the threshold voltage applied to the noninverting input of amplifier A2 biases it in a nonconducting state.

When the leading edge of a control signal pulse is applied to the control terminal 10, amplifier A2 will turn on and generate a high level voltage signal to the base of the selected driver transistor. The output level from amplifier A2 causes the transistor to conduct and pulls current from the battery voltage +B through the coil, the conducting transistor, and the sense resistor R11.

The control voltage applied at the noninverting input of amplifier A2 is sufficient to cause the amplifier to output a signal that will saturate the driver transistor. The amplifier A2 acts as a voltage follower whereby the amplifier attempts to equalize the voltages applied to both of its input terminals. As more current is pulled through the coil and saturated transistor the voltage developed in sense resistor R11 and hence on the sense line will rise and begin the equalization process.

The current through the selected inductor will as a consequence rise very quickly with a L/R time constant until the voltage at the inverting input of the amplifier A4 exceeds the threshold voltage applied to the noninverting input. This is the peak current level which can be adjusted by the variance of resistor R8 to change the threshold voltage.

At the time the current exceeds the peak threshold amplifier A4 will switch into a conducting state and resistor R3 will be paralleled with the variable resistor R2 through the output of the amplifier to ground. Further, the resistor R7 will be grounded through the output of the amplifier A4 to lower the threshold voltage applied to the noninverting input in order to latch the amplifier A4 into a conducting state.

The switching of the resistor R3 into the circuit will cause the voltage at the noninverting input of driver amplifier A2 to fall. The driver amplifier A2 will start to switch off; but the action of the capacitor C2 will slow the switching at a controlled slew rate. Thus, the amplifier A2 will not turn the driver transistor completely off which could cause the solenoid to drop out. The control voltage of the driver transistor is lowered until the voltages on the inputs to the driver amplifier A2 have equalized. This lower drive to the transistors will produce the holding current level for the injector. The initial holding current level can therefore be adjusted by the variance of resistor R2.

Importantly according to the invention, as the battery voltage +B changes, the voltage on the inverting input of the amplifier A2 because of resistor R5 will also change. If the battery voltage increases the output of the amplifier A2 and hence the holding current through the coils will decrease and conversely if the battery voltage decreases the holding current level will increase.

At the trailing edge of the control pulse the amplifier A2 will turn off and cause the selected driver transistor to become nonconducting. The collapsing magnetic field on the energized injector will produce an increasing positive voltage at the collector of the selected driver transistor. When the voltage exceeds the Zener breakdown voltage, the diode Z2 will conduct and dissipate the stored energy at a controlled rate.

FIGS. 2a and 2b illustrate the manner in which the regulation of the holding current by variations in the battery voltage accomplishes the stabilization of the opening and closing times of a solenoid of an electromagnetic fuel injector. In FIG. 2a there is shown a waveform 18 which represents the current through the coil of a solenoid driven by the preferred embodiment of the driver circuit. The waveform 18 comprises a peak current level $I_p$ and a holding current level IH1 for an injector turned on at the time marked pulse on and turned off at the time marked pulse off in the figure. The pulse on and pulse off times correspond to the leading and trailing edges of a control pulse such as that disclosed for transmission to terminal 10. It is seen that the current initially after the pulse on time occurs rises exponentially at the L/R time constant of the coil to where the armature or valve of the injector begins to pull in at point 13. At this time the inductance of the coil changes and there will be a slight dip in load current as the actuation of the armature opens the valve. This (as is seen in FIG. 2b) is the beginning of the actual injection or the open mode of the injector.

Thereafter the current continues to rise until the peak current level $I_p$ is reached to ensure the pull in current has been exceeded. The drive circuit switches once this level has been exceeded to limit the current to the holding current level IH1.

When the trailing edge of the pulse occurs, the solenoid driver circuit will cause the injector driver transistor to turn off and current will be controllably dissipated through the Zener diode Z2 at an exponential decay rate to where the drop out current level Id is reached. This point of time 19 corresponds to the actual closing of the armature at edge 24 as seen in FIG. 2b.

A second waveform 20 showing the coil current present at a higher battery voltage is illustrated in FIG. 2a. It is seen that the higher battery voltage causes the current to ramp at a higher rate than the waveform 18 (the L/R time constant remaining unchanged) and to pull in the armature sooner at point 15 such that a time differential $t_1$ exists between the opening of the injector with the waveform 20 at point 28 and that of the waveform 18 at point 22. The circuit operates through the negative feedback at the higher battery voltage to reduce the holding current to another holding level IH2. This lower holding current reduces the amount of energy stored in the inductance of the coil. When the pulse turns off, the smaller amount of energy stored allows the Zener diode to dissipate the energy quicker. The injector, therefore, reaches the drop out current level Id at point 21 relatively fast. By reaching the drop out point sooner a time difference of $t_2$ exists between the closing of the injector at 24 and the closing at 26.

If the time differentials $t_1$ and $t_2$ are equalized by knowing the constant rate of the discharge by the Zener diode and the differences in the time to the peak current, then the actual differentials in opening and closing times can be equivalently matched by varying the holding current as a function of battery voltage.

Preferably, the solenoid driver circuit described controls one or more conventional fuel injectors by generating a peak current of approximately 1.5 amps for each injector and a hold current in excess of their 200–300 milliamp drop out current. For such an advantageous configuration a 600 milliamp holding current is chosen at a nominal battery voltage of 13.5 V with a regulation of 100 milliamps/volt of deviation. The clamp voltage of 15 V is chosen to eliminate the possibility of the hold current being reduced to the point where the armature may drop out. The filter eliminates variations in holding current during pulse generation and large variations due to transient conditions.

While a preferred embodiment of the invention has been shown, it will be obvious to those skilled in the art that various modifications and changes may be made to the disclosed system without departing from the spirit and scope of the invention as defined in the hereinafter appended claims.

What is claimed is:

1. A method of controlling the actuation of a solenoid having a coil comprising the steps of:
    energizing the solenoid in response to the presence of a control signal by electrically coupling said coil to a voltage supply until a peak current level through said coil is obtained, and by altering said electrical coupling between said voltage supply and said coil to reduce the current therethrough to a holding current level once the peak current level is reached;
    regulating the holding current level as a function of the variations in voltage of said voltage supply; and
    dissipating, at a controlled rate, the energy stored in said coil as a result of said holding current level after the termination of said control signal.

2. A method as defined in claim 1 wherein the step of energizing the solenoid includes the steps of:
    sensing the current through the coil;
    developing a regulation voltage whose magnitude is representative of the magnitude of current through the coil;
    comparing the regulation voltage to a control voltage;
    increasing the current through the coil if the regulation voltage is less than the control voltage; and
    decreasing the current through the coil if the regulation voltage is greater than the control voltage.

3. A method as defined in claim 2 wherein the step of altering the electrical coupling includes:
    comparing said regulation signal to a peak current level and switching said control signal to a holding level value in response to said regulation signal exceeding said peak current value.

4. A method as defined in claim 3 wherein said step of regulating the holding current level includes:
    modifying the regulation signal such that it increases for increases in the voltage of the voltage supply and decreases for decreases in the voltage supply.

5. A method as defined in claim 4 wherein said step of modifying the regulation signal includes:
    clamping the modification of the regulation signal at a maximum value if the voltage of the voltage supply exceeds a predetermined value.

6. A method as defined in claim 5 wherein said step of modifying the regulation signal further includes:

filtering the voltage of the voltage supply so that it will not change substantially during the presence of a control signal due to transient factors.

7. A solenoid driver circuit comprising:
  means for controlling the actuating current through a coil of the solenoid in response to the presence of a control pulse by first increasing the current to a peak value and then decreasing the current to a hold value;
  means for dissipating, at a controlled rate, the stored energy in the coil as a result of the actuating current after the termination of said control pulse; and
  means for varying the hold current value as a function of the variations of the voltage supply.

8. A solenoid driver circuit as defined in claim 7 wherein said control means include:
  means for sensing the current passing through said coil and for generating a regulation signal representative of the magnitude thereof.

9. A solenoid driver circuit as defined in claim 8 wherein said control means further include:
  first means for comparing said regulation signal to a control voltage indicative of the desired current flow through said coil, said first comparing means increasing said current if the regulation signal is less than the control signal, and decreasing said current if the regulation signal is greater than the control signal.

10. A solenoid driver circuit as defined in claim 9 wherein said control means further includes:
  second means for comparing said regulation signal to a peak current level and for changing said control signal to a holding level once the peak level is attained.

11. A solenoid driver circuit as defined in claim 10 wherein:
  said variation means varies the regulation signal in response to changes in the voltage of said voltage supply.

12. A solenoid driver circuit as defined in claim 11 wherein said variation means further include:
  means for clamping the variation in the regulation signal to a maximum if the voltage of said voltage supply exceeds a predetermined amount.

13. A solenoid driver circuit as defined in claim 12 wherein said variation means further include:
  means for filtering said variation in the regulation signal so that said regulation signal does not change substantially during said pulse width.

14. A solenoid driver circuit as defined in claim 7 wherein said controlling means comprises:
  a first driver transistor with its power terminals connected in series with said coil and a sense resistor, said serial connection comprising a current path whose conductance is variable by controlling said driver transistor and whose current produces a regulation voltage indicative of the magnitude thereof in said sense resistor;
  a differential driver amplifier having a control voltage applied to one of its inputs and the regulation voltage applied to the other of its inputs and further having its output electrically coupled to the control terminal of said driver transistor, said driver amplifier comparing the regulation voltage to said control voltage in order to control the current through said serial connection as a function of the control voltage;
  a comparator receiving at one input the regulation voltage and at the other input a threshold voltage indicative of a peak current level for the serial connection; said comparator operable to switch said control voltage to a holding level value when the regulation voltage exceeds said peak threshold; and
  an input terminal connected to said control voltage input of said driver amplifier for receiving a control pulse signal that produces an initial control voltage.

15. A solenoid driver circuit as defined in claim 14 further including:
  a second driver transistor with its power terminals connected in series with a second coil of a second solenoid and said sense resistor;
  means, interposed between said driver amplifier output and the control terminals of said first and second driver transistors, for selecting one of said coils for actuation by said controlling means.

16. A solenoid driver circuit as defined in claim 15 wherein said selecting means includes:
  first and a second analog switches each having control terminals for determining their state of closure, said switches each having one contact commonly connected with the output of said driver amplifier and having the other individually connected to the control terminals of said first and second driver transistors;
  an inverter receiving a logical select signal at its input and further having its input and output terminals connected to the control terminals of said first and second switches respectively; said select signal controlling said switches to couple the output of said driver amplifier to one of said first and second driver transistors depending on the logical level of said select signal.

* * * * *